(12) United States Patent
Graham et al.

(10) Patent No.: US 7,117,463 B2
(45) Date of Patent: Oct. 3, 2006

(54) VERIFICATION OF DIGITAL CIRCUITRY USING RANGE GENERATORS

(75) Inventors: Robert M. Graham, Mountain View, CA (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 699 days.

(21) Appl. No.: 10/289,045

(22) Filed: Nov. 6, 2002

(65) Prior Publication Data

US 2004/0088622 A1    May 6, 2004

(51) Int. Cl.
G06F 17/50 (2006.01)

(52) U.S. Cl. .................... 716/5; 716/4; 716/3; 716/2

(58) Field of Classification Search .................... 716/5, 716/4, 3, 2
See application file for complete search history.

(56) References Cited

OTHER PUBLICATIONS

Andreas Kuehlmann, et.al., Equivalence Checking Using Cuts and Heaps, ACM, IBM Thomas J. Watson Research Center, Yorktown Heights, NY.
Evgueni I. Goldberg, et. al., Using SAT for Combinational Equivalence Checking, University of Berkeley.
Henrik Hulgaard, et. al., Equivalence Checking of Combinational Circuits using Boolean Expression Diagrams, IEEE Transactions on CAD, Jul. 1999.
Chung-Yang (RIC) Huang, et. al., Static Property Checking Using ATPG v.s. BDD Techniques, University of California Santa Barbara, CA.
Alan Mishchenko, BDDs and Their Applications, www.ee.pdx.edu/alanmi/510FM2/510OCE-16.pdf, May 2000.
Congguang Yang, et. al., BDS: A BDD-Based Logic Optimization System, Uiversity of Massachusetts, Dept of Electrical & Computer Engineering, ACM, 2000, DAC.
Navin Vemuri, et. al., BDD-based Logic Synthesis for LUT-based FPGAs, ACM, 2002, Association for Computing Machinery.
Randal E. Bryant, Ordered Binary Decision Diagrams BDD, IEEE Transactions on Computers, vol. C-35, No. 8, 1986.
Sandeep K. Shukla, An Introduction to Formal Verification, CECS/ICS/University of California, Irvine.
R. P. Kurshan, Formal Verification in a Commercial Setting, The Verification Times, Bell Laboratories, 1997, Association for Computing Machinery, Inc.
Kurt Keutzer, Professor, Implementation Verification: Static Timing Verification, University of California Berkeley, CA.
Jim Smith, et. al., Polynomial Methods for Allocating Complex Components, Computer Systems Laboratory, Stanford University.
Wolfgang Kunz, Verification Problems and Solutions, Dept. of Computer Science, University of Frankfurt/Main, Germany.
Shi-Yu Huang, Formal Equivalence Checking And Design Debugging, 1998, Chapters 3-4, Kluwer Academic Publishers, Norwell, Massachusetts, USA.

*Primary Examiner*—Sun James Lin
(74) *Attorney, Agent, or Firm*—Blakely, Sokoloff, Taylor & Zafman LLP

(57) ABSTRACT

An embodiment of the present invention includes a range generator to simplify equivalence checking. A range generator is constructed. The range generator is represented by a characteristic function of a range of a cut function for a cut circuit in an implementation circuit and a reference circuit. The range generator is simpler than the cut circuit. Equivalence of the implementation circuit and the reference circuit is checked using the range generator.

108 Claims, 10 Drawing Sheets

VERIFICATION OF DIGITAL CIRCUITRY USING RANGE GENERATORS

BACKGROUND

1. Field of the Invention

Embodiments of the invention relate to the field of electronic design automation (EDA), and more specifically, to equivalence checking.

2. Description of Related Art

Equivalence checking has become important in many design synthesis and optimization tools. In equivalence checking, an implementation circuit is compared with a reference circuit to determine if the two circuits are functionally equivalent. There are a number of techniques in equivalence checking: functional, automatic test pattern generation (ATPG), and incremental. Functional approaches use Binary Decision Diagrams (BDD's) to compare the two circuits. The circuits are equivalent if and only if their corresponding BDD's are isomorphic. ATPG approaches prove the equivalence of the two circuits under verification by proving that the stuck-at-0 is a redundant fault for their miter output. A variation of the ATPG is the Boolean Satisfiability (SAT) technique. Incremental approaches are based on reducing the miter circuit through the identification of internal equivalent pairs of the circuit nodes. Among these techniques, those using BDD's are popular.

The use of BDD's has a number of problems. First, if the circuit (or its subcircuits) are complex, their BDD's may become quite large, exceeding allocated storage and leading to high processing time. Second, false negatives may result. A false negative is a problem in which the two circuits are equivalent but the equivalence checker or verifier declares them as different.

Therefore, there is a need to have an efficient technique to improve verification of digital circuits.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a range generator to simplify equivalence checking. A range generator is constructed. The range generator is represented by a characteristic function of a range of a cut function for a cut circuit in an implementation circuit and a reference circuit. The range generator is simpler than the cut circuit. Equivalence of the implementation circuit and the reference circuit is checked using the range generator.

In the following description, numerous specific details are set forth. However, it is understood that embodiments of the invention may be practiced without these specific details. In other instances, well-known circuits, structures, and techniques have not been shown in order not to obscure the understanding of this description.

Figure 1:
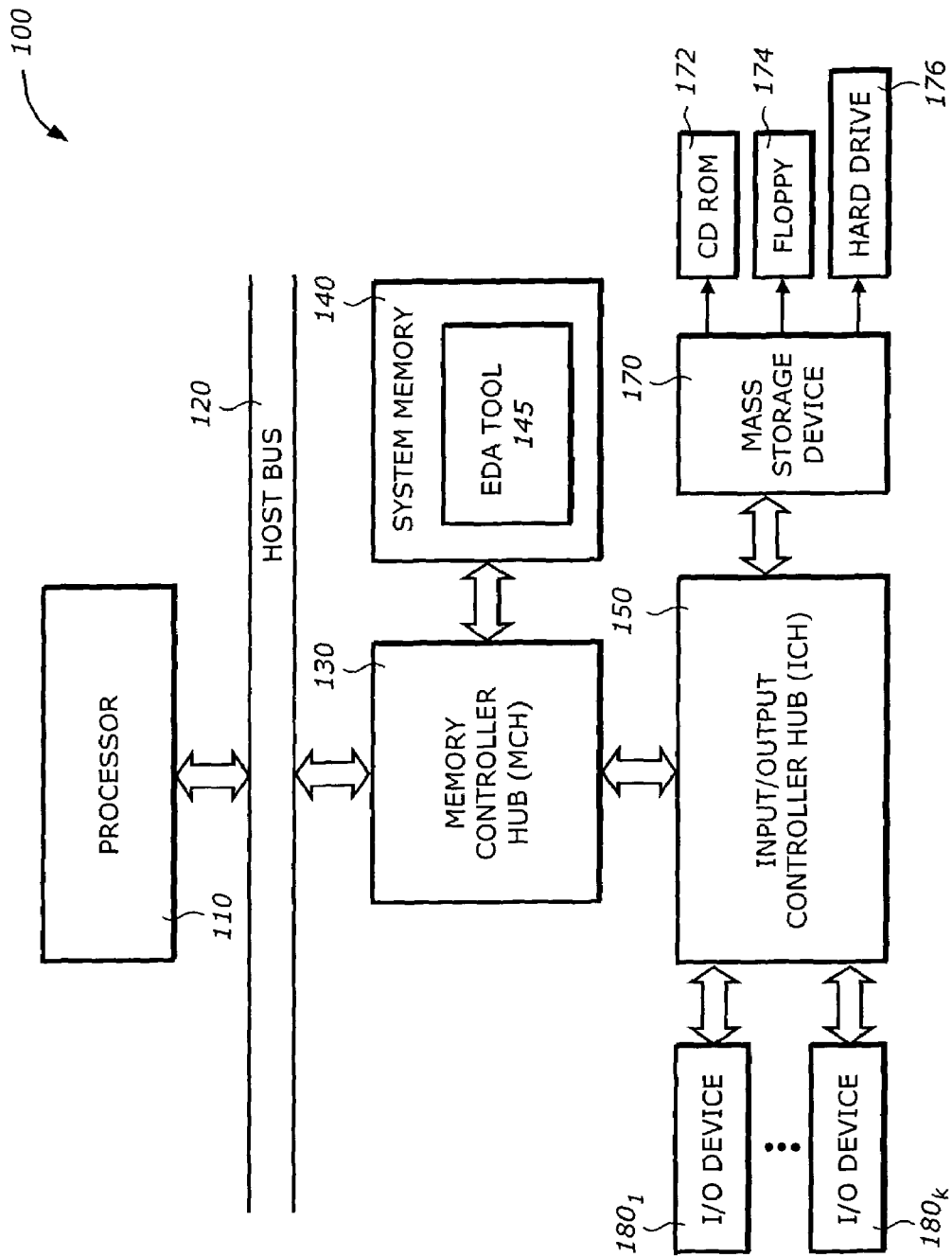
FIG. 1 is a diagram illustrating a system in which one embodiment of the invention can be practiced.

FIG. 1 is a diagram illustrating a computer system 100 in which one embodiment of the invention can be practiced. The computer system 100 includes a processor 110, a host bus 120, a memory control hub (MCH) 130, a system memory 140, an input/output control hub (ICH) 150, a mass storage device 170, and input/output devices $180_1$ to $180_K$.

The processor 110 represents a central processing unit of any type of architecture, such as embedded processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. In one embodiment, the processor 110 is compatible with the Intel Architecture (IA) processor, such as the IA-32 and the IA-64. The host bus 120 provides interface signals to allow the processor 110 to communicate with other processors or devices, e.g., the MCH 130. The host bus 120 may support a uniprocessor or multiprocessor configuration. The host bus 120 may be parallel, sequential, pipelined, asynchronous, synchronous, or any combination thereof The MCH 130 provides control and configuration of memory and input/output devices such as the system memory 140 and the ICH 150. The MCH 130 may be integrated into a chipset that integrates multiple functionalities such as the isolated execution mode, host-to-peripheral bus interface, memory control. For clarity, not all the peripheral buses are shown. It is contemplated that the system 100 may also include peripheral buses such as Peripheral Component Interconnect (PCI), accelerated graphics port (AGP), Industry Standard Architecture (ISA) bus, and Universal Serial Bus (USB), etc.

The system memory 140 stores system code and data. The system memory 140 is typically implemented with dynamic random access memory (DRAM) or static random access memory (SRAM). The system memory may include program code or code segments implementing one embodiment of the invention. The system memory includes an electronic design automation (EDA) tool 145. The EDA tool 145 may also be implemented by hardware, software, firmware, microcode, or any combination thereof. The EDA tool 145 may include a design synthesis tool, a verifier, an equivalence check, etc., or any combination thereof. The system memory 140 may also include other programs or data which are not shown, such as an operating system.

The ICH 150 has a number of functionalities that are designed to support I/O functions. The ICH 150 may also be integrated into a chipset together or separate from the MCH 130 to perform I/O functions. The ICH 150 may include a number of interface and I/O functions such as PCI bus interface, processor interface, interrupt controller, direct memory access (DMA) controller, power management logic, timer, universal serial bus (USB) interface, mass storage interface, low pin count (LPC) interface, etc.

The mass storage device 170 stores archive information such as code, programs, files, data, applications, and operating systems. The mass storage device 170 may include compact disk (CD) ROM 172, floppy diskettes 174, and hard drive 176, and any other magnetic or optic storage devices. The mass storage device 170 provides a mechanism to read machine-readable media.

The I/O devices $180_1$ to $180_K$ may include any I/O devices to perform I/O functions. Examples of I/O devices $180_1$ to $180_K$ include controller for input devices (e.g., keyboard, mouse, trackball, pointing device), media card (e.g., audio, video, graphics), network card, and any other peripheral controllers.

Elements of one embodiment of the invention may be implemented by hardware, software, firmware, microcode, or any combination thereof. When implemented in software, firmware, or microcode, the elements of the embodiment of the present invention are the program code or code segments to perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc. The program or code segments may be stored in a processor readable medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the machine accessible medium include an electronic circuit, a semiconductor memory device, a ROM, a flash memory, an erasable ROM (EROM), a floppy diskette, a compact disk (CD-ROM), an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operation described in the following. The term "data" here refers to any type of information that is encoded for machine-readable purposes. Therefore, it may include program, code, data, file, etc.

All or part of an embodiment of the invention may be implemented by software. The software may have several modules coupled to one another. A software module is coupled to another module to receive variables, parameters, arguments, pointers, etc. and/or to generate or pass results, updated variables, pointers, etc. A software module may also be a software driver or interface to interact with the operating system running on the platform. A software module may also be a hardware driver to configure, set up, initialize, send and receive data to and from a hardware device.

It is noted that an embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Figure 2:
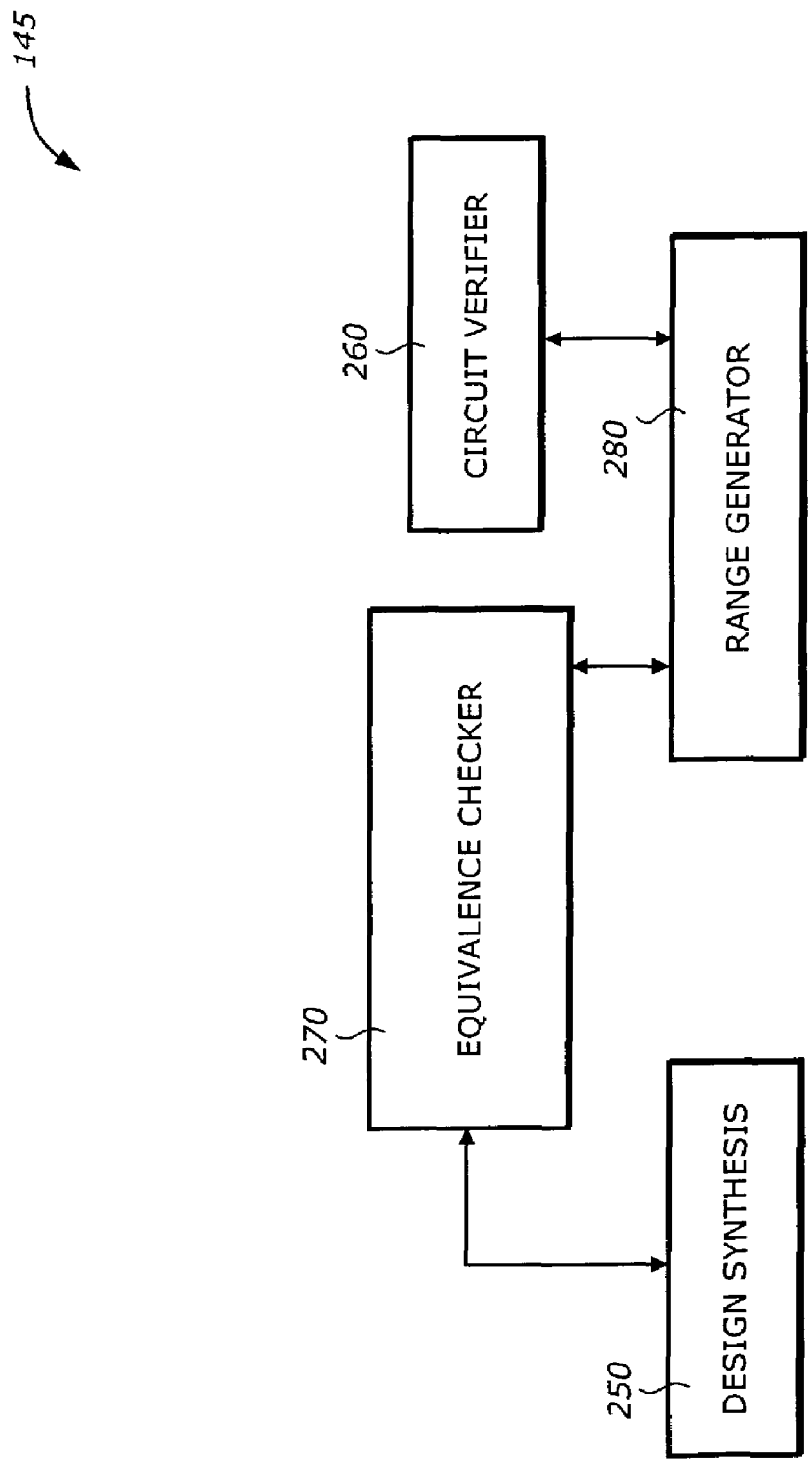
FIG. 2 is a diagram illustrating an EDA tool shown in FIG. 1 according to one embodiment of the invention.

FIG. 2 is a diagram illustrating an EDA tool 145 shown in FIG. 1 according to one embodiment of the invention. The EDA tool 145 includes a design synthesis tool 250, a circuit verifier 260, an equivalence checker 270, and a range generator 280. Note that this is only for illustrative purposes. The EDA tool 145 may have more or less components than listed above. The EDA tool 145 may be a software package in a computer aided design (CAD) environment. The EDA tool 145 is used by design engineers for designing, synthesizing, simulating, and verifying a circuit or a project. The EDA tool 145 may be used as part of a design process for Applications Specific Integrated Circuit (ASIC) devices, programmable device such as programmable logic devices (PLD), complex PLD (CPLD), field programmable logic array (FPGA), etc.

The equivalence checker 270 checks for equivalence of circuits. The equivalence checker 270 compares a reference (REF) network to an implementation (IMP) network with corresponding primary inputs and outputs to determine if the implementation network is valid for the reference. This is performed by determining if the function of each output of the IMP network is equivalent to or the same as (except for don't cares) the function of the corresponding output of the REF network. Typically, the corresponding inputs in REF and IMP networks are associated with the same variables. There are many techniques to do equivalence checking. The techniques in the present invention may employ any formal logic representation. Examples of these formal representations include composition of component abstractions, binary coded graphs (BCG), binary decision diagram (BDD), linear constraints represented by convex polyhedra, abstraction interpretation, deductive methods, polynomial representations, logic augmentations and transformations, etc. For example, when the BDD is used, it is used to represent the REF and IMP networks or circuits. The two circuits are equivalent if their BDD's are identical.

A common problem with the use of BDDs is when the circuit is too complex; its BDD may become too large, exceeding the available storage or prohibitively increasing processing time. To solve this memory storage problem, a method referred to as a partitioned BDD method can be employed to partition or decompose the original BDD into smaller BDD's, and equivalence of internal points is checked. In functional decomposition, each function is decomposed into functional blocks. Each block is then represented by a BDD using the partitioned BDD method. Then, cut points are defined. Verification or equivalence checking can be performed at the cut points starting at the primary inputs. One problem with the functional decomposition method using partitioned BDD's is the false negative problem. This problem results when the verifier or the equivalence checker determines that two circuits are different when in fact they are equivalent. There are a number of causes that lead to the false negative problem. One major cause is that the newly created intermediate variables increase the size of the domain space used during equivalence checking of the primary outputs. Mismatches may occur on the intermediate input points which never arise in the IMP and REF networks. In other words, the range of the cut functions is erroneously expanded. To eliminate this problem, therefore, it is necessary to generate the correct range of the cut functions.

The range generator 280 replaces functions of a circuit. The range generator 280 generates identical range as that of the circuit but it has better verification properties. It may have fewer variables in the formal representation to help reduce the size of the formal representations dependent on the cut. For example, when the BDD technique is used, it may have fewer nodes in the BDD to speed up operations dependent on the cut functions. The range generator 280 is generally useful for verification tasks within a synthesis environment. The range generator 280 can also be used in any other applications that have similar requirements.

A range generator may be a super-set range generator (SRG) or an exact range generator (RG). A super-set range generator is one that computes a larger range than the cut functions. This is useful for verification in the following way: If no mismatches are detected when a super-set range generator replaces the pre-cut functions, then there are no mismatches when the exact range generator (RG) is used (because the SRG contains the exact RG). It may be possible to compute a (simpler) SRG and prove equivalence quickly using the SRG. If there are mismatches then either (1) the exact RG (or some other method) is used, or (2) any false negative mismatches may be eliminated by re-verifying exactly the input combinations where a mismatch was detected. The exact RG can be used to minimize the underlying formal representation (e.g., BDD) in the post-cut circuit. On the cut, the only achievable values are generated by the RG. If the complement of the achievable set is computed then a don't care function can be used to minimize any formal representation in the post-cut circuit dependent on the cut variables. For example, one well-known method is called "generalized co-factoring" of the post-cut BDD using the don't care function.

Another use of the RG is to leave the cut variables in the verification of the post-cut circuit. When a difference function for a primary output is computed, depending partly on the cut variables, the cut functions can be substituted into the difference function. If there are no actual mismatches, the difference function will vanish; e.g., becoming 0. If the difference function does not vanish then the remaining difference function contains true mismatches.

There are a number of ways to produce the range generators and the superset range generators. In the first method, the original precut or cut circuit is simplified such that its range is not changed, or is tested not to change. In the second method, the cut is partitioned into subcut circuits; then, sub range generators corresponding to the subcut circuits are created. The composition of the sub range generators forms a superset range generator for the cut circuit. In the third method, a subcut Y of a cut H=F(Y) is obtained which has a known superset range generator R. The SRG of H is then obtained as F(R).

Once the characteristic range functions, range generators, and superset range generators are obtained, the equivalence checking can be performed efficiently with reduced memory usage and improved runtime of the verification algorithms.

Let I be the primary inputs, H(I) be a precut/cut function representing a precut/cut circuit, $G_1$ and $G_2$ be the two circuits that need to be checked for equivalence, e.g., implementation and reference circuits, and R be the range generator represented by a characteristic range function $f_R$. R may be an exact RG or a SRG as discussed above. The equivalence checking of $G_1(H(I))$ and $G_2(H(I))$ is transformed or converted into the equivalence checking of $G_1(R)$ and $G_2(R)$. Since R is typically much simpler than H(I), the equivalence checking of $G_1(R)$ and $G_2(R)$ is much simpler than that of $G_1(H(I))$ and $G_2(H(I))$, resulting in efficient memory usage and processing time.

There are four methods to perform equivalence checking of $G_1(R)$ and $G_2(R)$. Specific implementations of these methods depend on the type of formal representation used.

In the first method, comparable representations for $G_1(R)$ and $G_2(R)$ are obtained. Once the range generators are substituted for H(I), $G_1(R)$ and $G_2(R)$ may be manipulated, re-arranged, transformed, or converted into representations that can be directly compared.

In the second method, $G_1(R)$ and $G_2(R)$ are simplified using the characteristic range function as a care set. The care set is the set that does not include don't cares. There are a number of techniques to simplify $G_1(R)$ and $G_2(R)$. One simple technique is to detect internal gates in the circuit of $G_1(R)$ or $G_2(R)$ that produce constant outputs inside the care set and replace these gates with constants. Another technique is to compute the observability of inputs of internal gates in the circuit of $G_1(R)$ or $G_2(R)$ and see if connecting those inputs to other nodes or to constants changes the observable output function under the care set. If no change is observed and the new connection simplifies the circuit, then the change is made. Otherwise, no change is made.

In the third method, a difference function Diff (H(I)) between the implementation and the reference circuits $G_1$(H(I)) and $G_2$(H(I)) is computed using the cut function. For example, Diff(H(I))=$G_1$(H(I)) XOR $G_2$(H(I)). Then, the cut function H(I) is replaced by the characteristic range function $f_R$ in the difference function. Next, the logic values of the difference function are determined using the characteristic range function $f_R$. If the logic values are not constant false and if R is an exact RG, then non-equivalence is proved.

In the fourth method, any combination of the first, second, and third methods above is used. For example, $G_1(R)$ and $G_2(R)$ may be first simplified using a SRG for H(I) as in the second method; then, an exact RG is substituted as in the first method. As another example, the second method may be applied before the third method.

Figure 3:
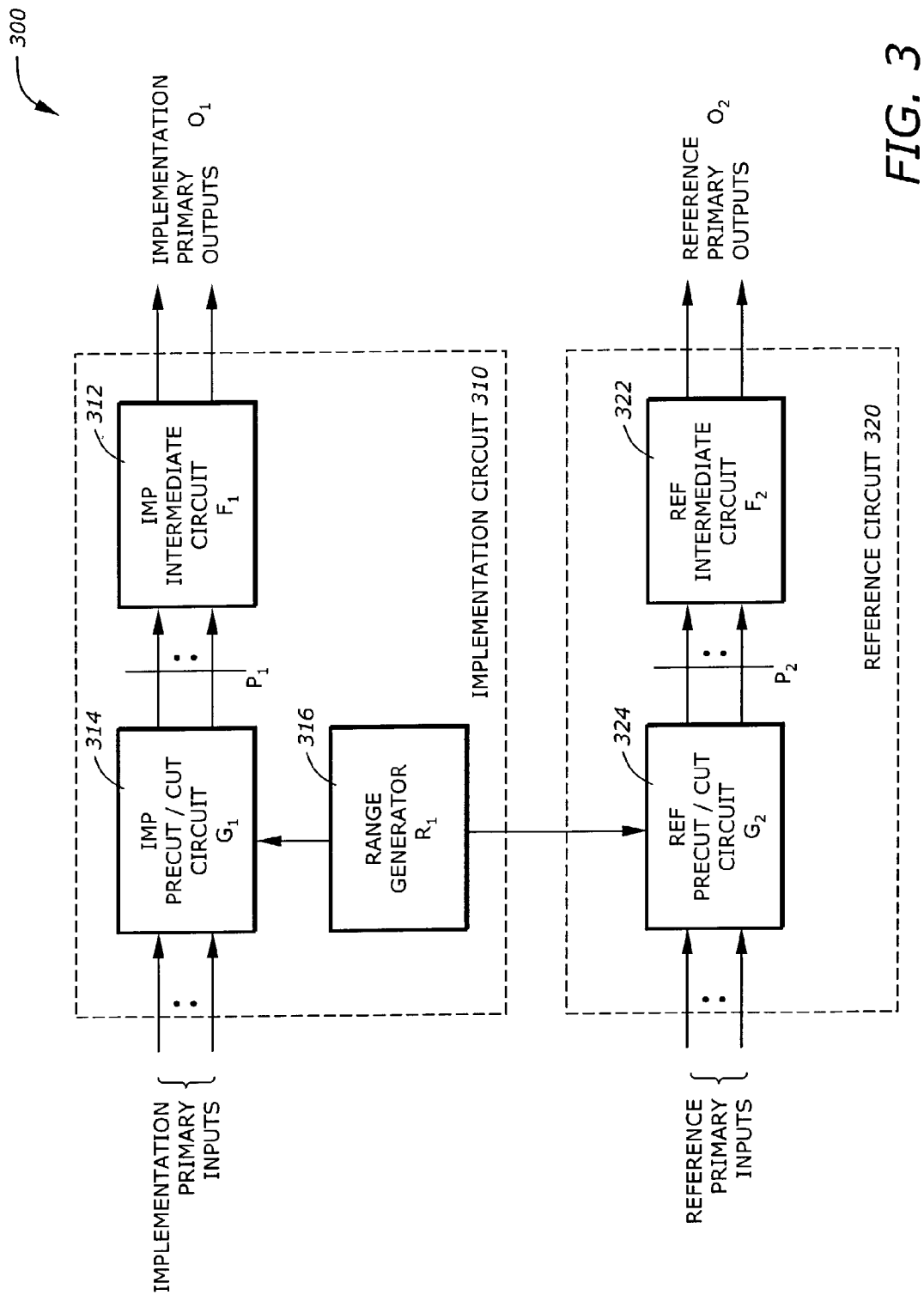
FIG. 3 is a diagram illustrating an equivalence checking environment according to one embodiment of the present invention.

FIG. 3 is a diagram illustrating an equivalence checking environment 300 according to one embodiment of the present invention. The equivalence checking environment 300 includes an implementation circuit 310 and a reference circuit 320. The equivalence checking is to determine if the implementation circuit 310 is equivalent to the reference circuit 320.

The implementation (IMP) circuit 310 includes an IMP intermediate circuit F1 312, an IMP precut/cut circuit G1 314, and a range generator R1 316. The intermediate circuit 312 processes the output of the precut circuit 314 at cut point P1 and generates the IMP primary outputs O1. The cut point P1 decomposes the IMP circuit 310 into functional blocks to reduce the complexity of a large BDD. The IMP precut circuit 314 includes a collection of signals such that for some set of primary inputs, all paths from them to any primary output passes through the IMP precut circuit 314. In essence, the IMP precut circuit 314 isolates the set of primary inputs from the other downstream gates in the IMP circuit 310. In one embodiment, the IMP precut circuit 314 may be a more general cut circuit which does not necessarily isolate a set of primary inputs. In other words, a primary input may have paths passing through the cut circuit and other paths going around the cut to the primary outputs. The range generator 316 is a functional representation which has the same range as the IMP precut circuit 314. The range generator 316 is an instance of the range generator 280 shown in FIG. 2. The range generator 316 replaces the IMP precut circuit 314 to generate the range of the cut variables. The range generator 316 avoids the false negative problem by ensuring that the false mismatches are never generated, and therefore there is no need to eliminate mismatches after they are found. The range generator 316 changes the functional representation at intermediate signals by replacing the functions with its outputs. The range generator 316 helps reducing the computational complexity of the global problem of equivalence checking rather than dealing with local properties.

The REF circuit 320 includes a REF intermediate circuit F2 322 and a REF precut/cut circuit G2 324. The REF intermediate circuit F2 322, the REF precut/cut circuit G2 324 are essentially similar to the respective IMP intermediate circuit F1 312, and the IMP precut/cut circuit G1 314 except that they are from the reference circuit that the IMP circuit 310 is compared against. The range generator 316 is also used to replace the REF precut circuit 324 to generate the range of the cut variables.

Figure 4:
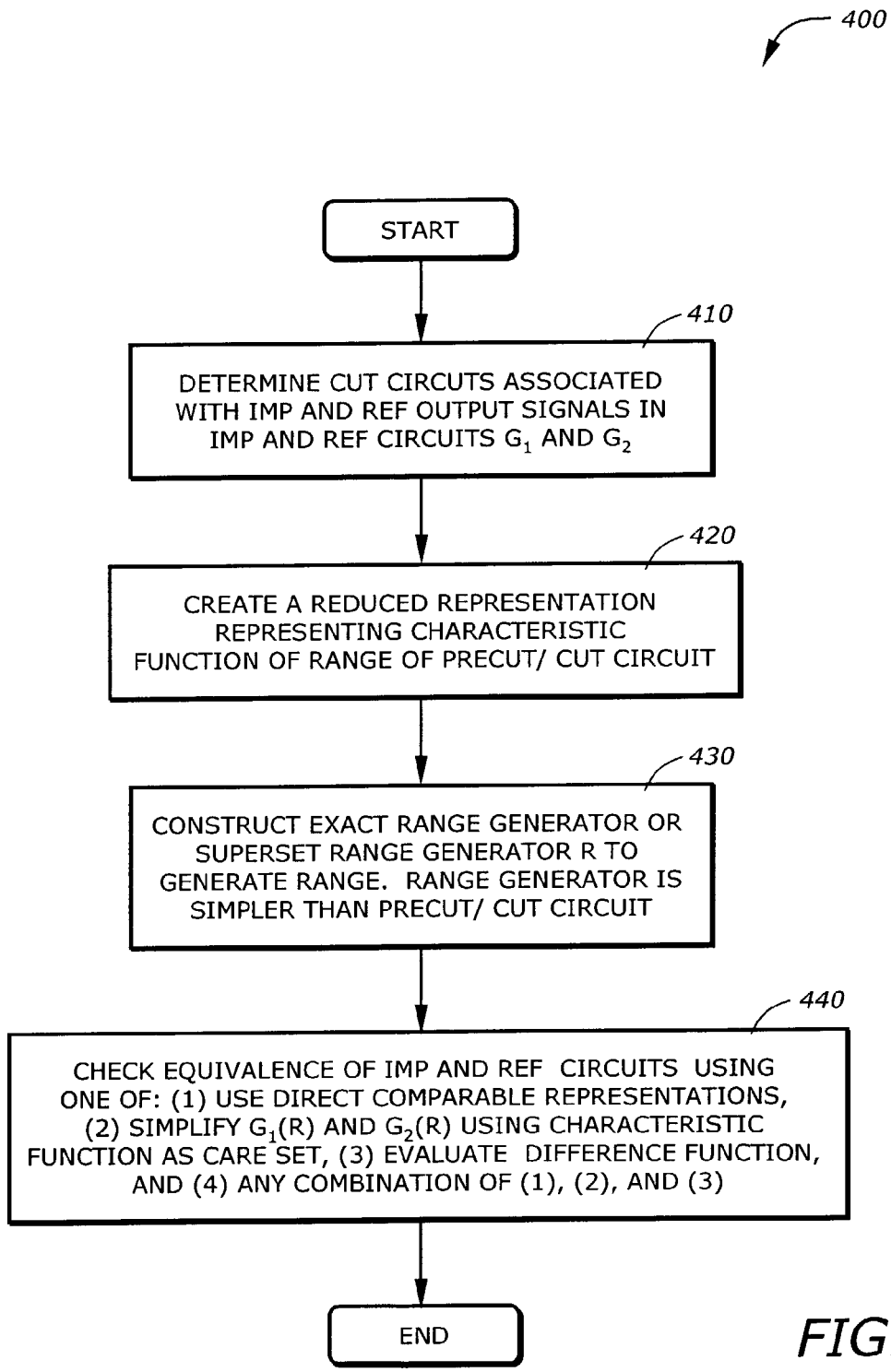
FIG. 4 is a flowchart illustrating a process to improves equivalence checking using range generator according to one embodiment of the present invention.

FIG. 4 is a flowchart illustrating a process 400 to improve equivalence checking using range generator according to one embodiment of the present invention. Note that not all of the blocks shown here are needed. For example, the cut circuit may be determined by any other method and is used as an input to the range generator.

Upon START, the process 400 determines a precut/cut circuit associated with the IMP and REF output signals in the IMP and REF circuits (Block 410). Next, the process 400 creates a reduced representation representing the characteristic function of the range of the precut/cut circuit (Block 420). Then, the process 400 constructs a range generator to generate the range using any of the methods described above (Block 430). The range generator has a range representation which may be simpler than the original representation or its reduced form. For example, it may have fewer variables and/or fewer nodes than those of the reduced representation. Then, the process 400 performs checking equivalence of the implementation circuit and the reference circuit using the range generator (Block 440). The equivalence checking may be performed using any one of the four methods described above. Then the process 400 is terminated. Other range generators are possible.

In the following, for illustrative purposes, the description uses the BDD as a formal representation method. It is contemplated that any other formal representations may be used.

Figure 5:
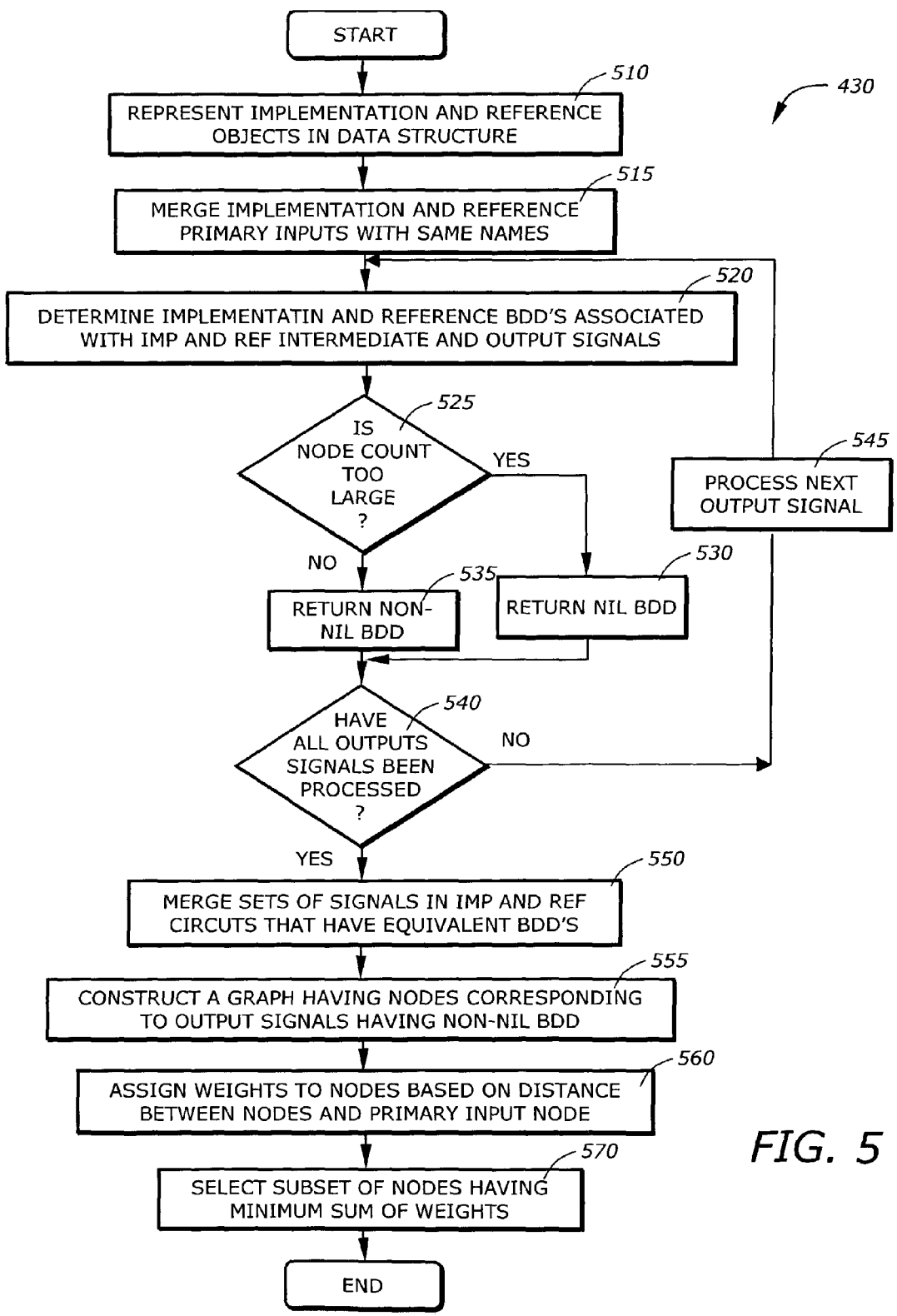
FIG. 5 is a flowchart illustrating a process to determine a cut circuit according to one embodiment of the invention.

FIG. 5 is a flowchart illustrating the process 410 to determine a cut circuit according to one embodiment of the invention. As mentioned earlier, this process 410 may not be important for the subsequent tasks because any technique that determines the precut/cut circuit can be employed for the range generator.

Upon START, the process 410 represents the IMP and REF objects in appropriate data structures (Block 510). These objects may include primary inputs, primary outputs, gates and signals. Connections between these objects may be stored in linked lists as appropriate. Next, the process 410 merges the IMP and REF primary inputs that have the same names (Block 515). By doing so, there is only one signal connected to each primary input. It is noted that primary outputs are matched between the IMP and REF circuits but are not merged together. Then, the process 410 determines the IMP and REF BDD's associated with the IMP and REF output signals.

Next, the process 410 determines if the node count in the BDD is greater than a predetermined threshold, nodemax (Block 525). If so, the process 410 returns a nil BDD associated with the output signal in consideration (Block 530) and proceeds to Block 540. Otherwise, the process 410 returns a non-nil BDD (Block 535). Then, the process 410 determines if all output signals have been processed (Block 540). If not, the process 410 processes the next output signal (Block 545) and returns to Block 520. Otherwise, the process 410 merges sets of signals in the IMP and REF circuits that have equivalent BDD's (Block 550).

Next, the process 410 constructs a directed acyclic graph that has nodes corresponding to the output signals having non-nil BDD's (Block 555). Then, the process 410 assigns weights to nodes based on distance between them and a primary input node (Block 560). Typically, the shorter the distance, the larger the weight. The purpose of larger weights near the primary inputs is to make deeper cuts more likely to be chosen. Next, the process 410 selects subset S of nodes such that all paths from inputs to outputs pass through S and the sum of weights on S is minimal (Block 565). S forms a minimal cut of the graph given the weights on the node. The motivation for finding a minimal cut is to reduce the upper bound on the size of the range. The process 410 is then terminated.

Figure 6:
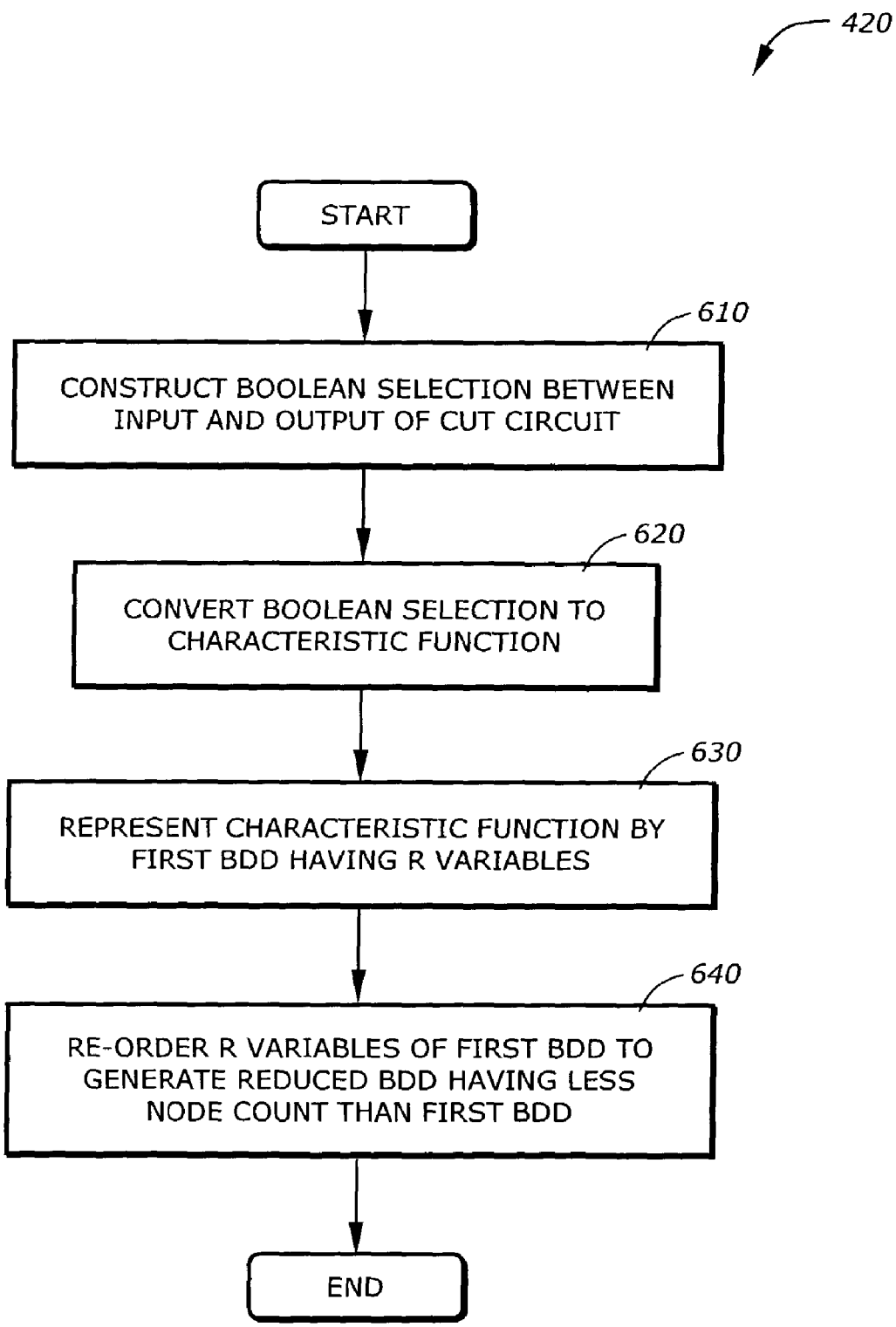
FIG. 6 is a flowchart illustrating a process to create a reduced Binary Decision Diagram according to one embodiment of the present invention.

FIG. 6 is a flowchart illustrating the process 420 to create a reduced Binary Decision Diagram according to one embodiment of the present invention.

Upon START, the process 420 constructs a set of BDDs between the inputs and outputs of the precut/cut circuit (Block 610). The variables in the Boolean relation include the relevant primary inputs and variables for the cut points in the precut/cut circuit. Next, the process 420 converts the Boolean relation to a characteristic function F (Block 620). This can be done by applying existential quantification, or smoothing, to the primary input variables. The characteristic function F depends only on the cut variables and is true for values that are achievable on the cut signals. In other words, F is true on the range of the cut functions.

Next, the process 420 represents the characteristic function F by a first BDD which has R variables (Block 630). Then, the process 420 re-orders the R variables of the first BDD to generate a reduced BDD that typically has lower node count than the first BDD (Block 640). The process 420 is then terminated.

Figure 7:
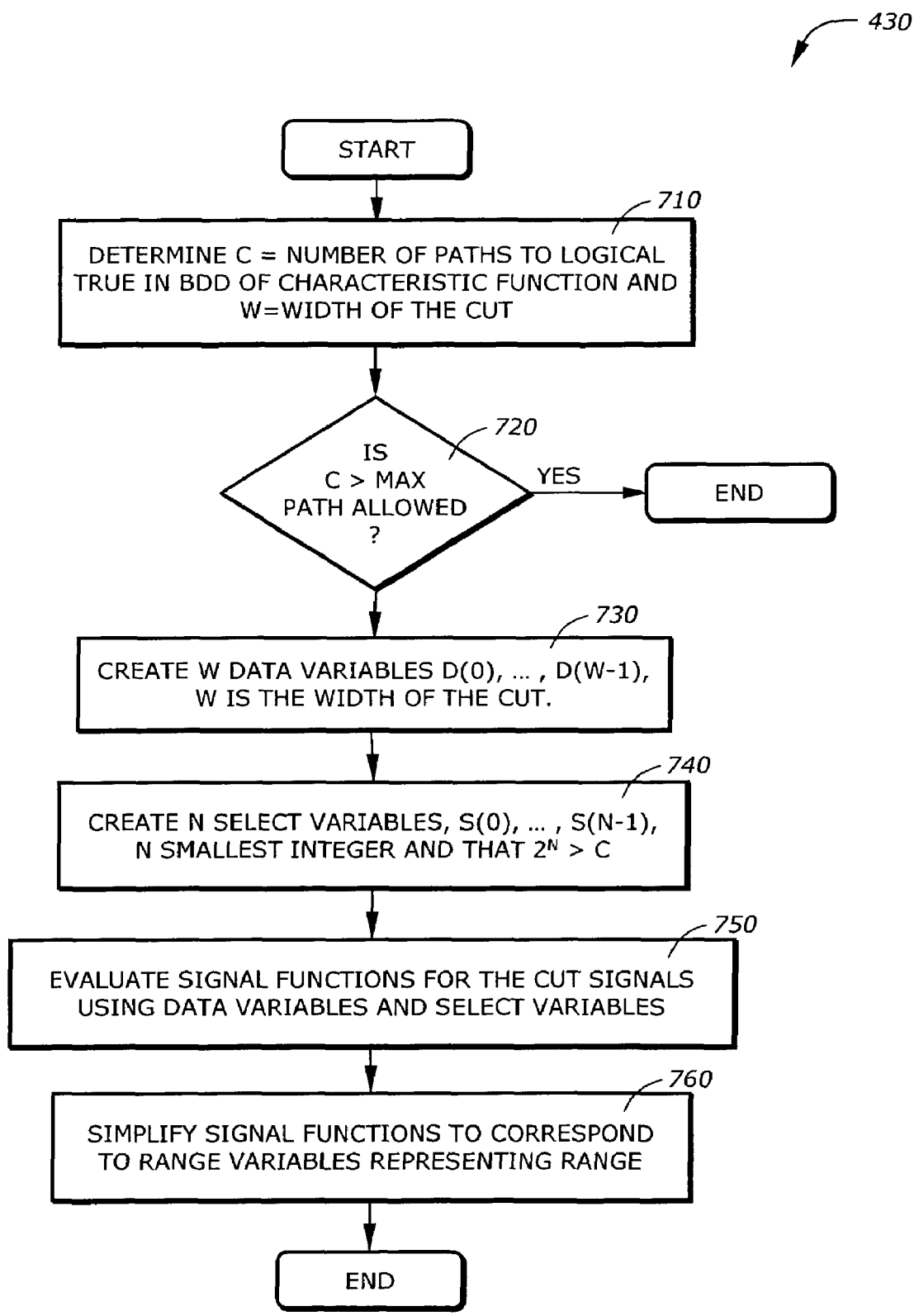
FIG. 7 is a flowchart illustrating a process to construct a range generator according to one embodiment of the present invention.

FIG. 7 is a flowchart illustrating the process 430 to construct range generator according to one embodiment of the present invention.

Upon START, the process 430 determines C as the number of paths to true (logical 1) in the BDD of the characteristic function and W as the width of the cut (Block 710). Next, the process 430 determines if C is greater than a predetermined threshold maxpath (Block 720). If so, the BDD may be larger than the allowable memory or the processing time may become prohibitively long, the process 430 is terminated. Otherwise, the process 430 creates W data variables $D(0), \ldots, D(W-1)$ (Block 730). Next, the process 430 creates N select variables $S(0), \ldots, S(N-1)$ where N is the smallest integer such that $2^N > C$ (Block 740).

Figure 8:
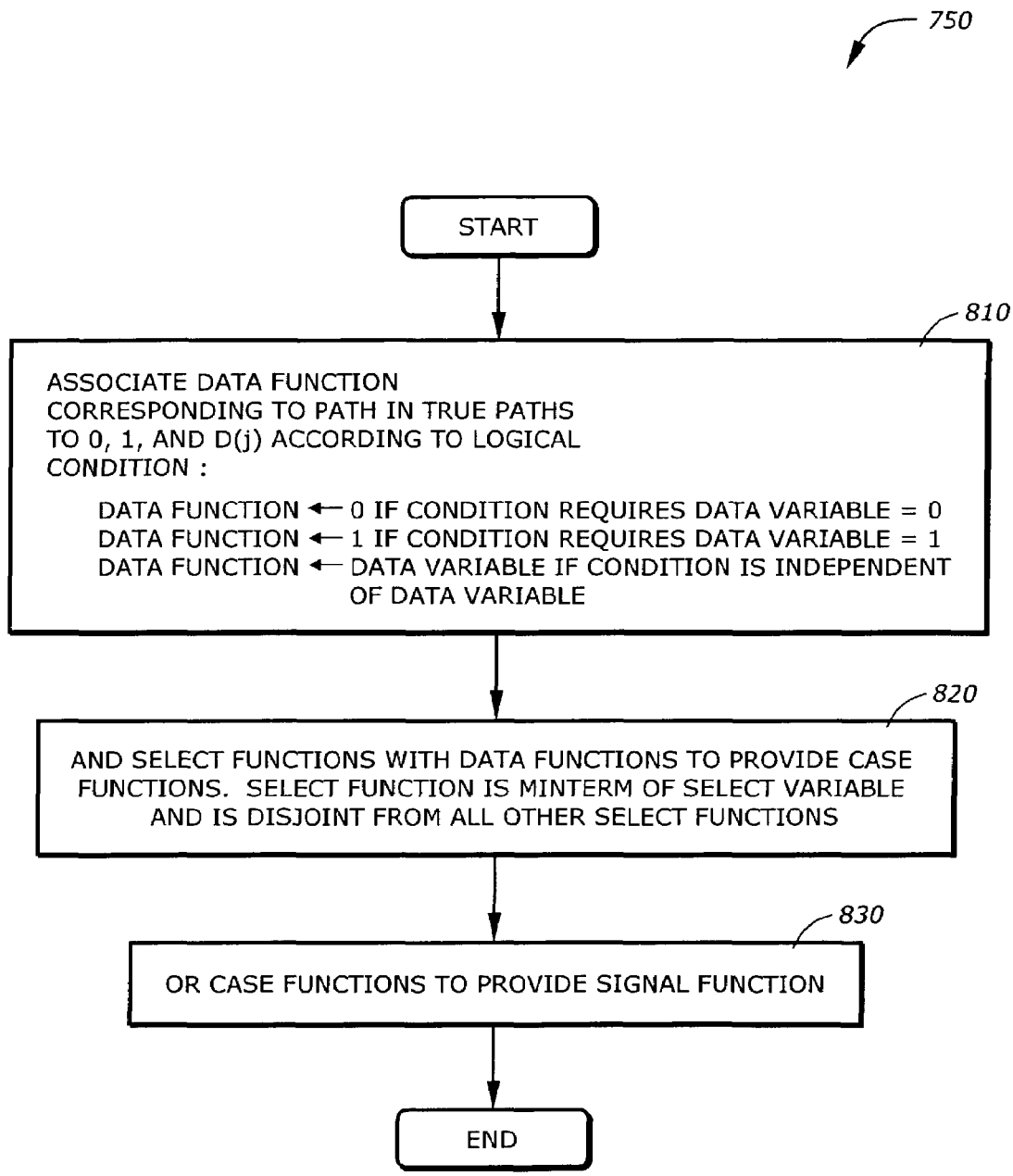
FIG. 8 is a flowchart illustrating a process to evaluate signal functions according to one embodiment of the present invention.

Then, the process 430 evaluates signal functions for the cut signals using the data variables and the select variables (Block 750). Details of Block 750 are shown in FIG. 8. Next, the process 430 simplifies the signal functions to correspond to range variables representing the range (Block 760). Then, the process 430 is terminated.

FIG. 8 is a flowchart illustrating the process 750 to evaluate signal functions according to one embodiment of the present invention.

Upon START, the process 750 associates data functions corresponding to a path in the true paths to logical 0, 1, or data variable D(j) according to a logical condition (Block 810). The true paths are those paths in the BDD that lead to the logical 1. The operations based on the logical condition are as follows. If the logical condition requires the data variable to be logical 0 in path j, the data function is assigned a logical 0. If the logical condition requires the data variable to be logical 1 in path j, the data function is assigned a logical 1. If the logical condition is independent of the data variable in path j, the data function is assigned the data variable corresponding to D(j).

Next, the process 750 performs an AND operation on the select functions and the data functions to provide C case functions (Block 820). The select function is the minterm of the select variable and is disjoint from all other select functions. Then, the process 750 performs an OR operation on the case functions generated in Block 820 to provide the signal functions (Block 830). The process 750 is then terminated.

The process 750 can also be described in the following pseudo code. The procedure uses BDD_AND(f,g), BDD_OR(f,g), and BDD_NOT(f) to implement the logical operations AND, OR, and NOT on f and g where f and g are BDD's.

```
procedure range-generator
    for each signal-function (0, ..., W-1) do
signal-function[j] = 0;
    end for;
    pathindex = 0;
    for each path (0,. . ., N-1) in BDD of characteristic function F do
        select-function = 1;
        for each bit of pathindex do
            if (bit of pathindex is odd)
                select-function = BDD_AND(select-function, S(bit));
            else
                select-function = BDD_AND(select-function,
                    BDD_NOT(S(bit)));
            end if;
        end for;
        /* augment each signal-function */
        for each variable j in data-variables (D(0),. . ., D(W-1)) do
            if (i-th path requires D(j) = 0)
                data-function = 0;
            else if (i-th path requires D(j) = 1)
                data-function = 1;
            else data-function = BDD_VAR(j);
            end if;
            signal-function[i] = BDD_OR(signal-function[i],
                BDD_AND(data-function, select-function));
        end for;
        pathindex = pathindex + 1;
    end for;
    for each signal-function (0, .., W-1) do
        assign signal-function[j] to the j-th net in the cut;
    end for;
end procedure;
```

Figure 9:
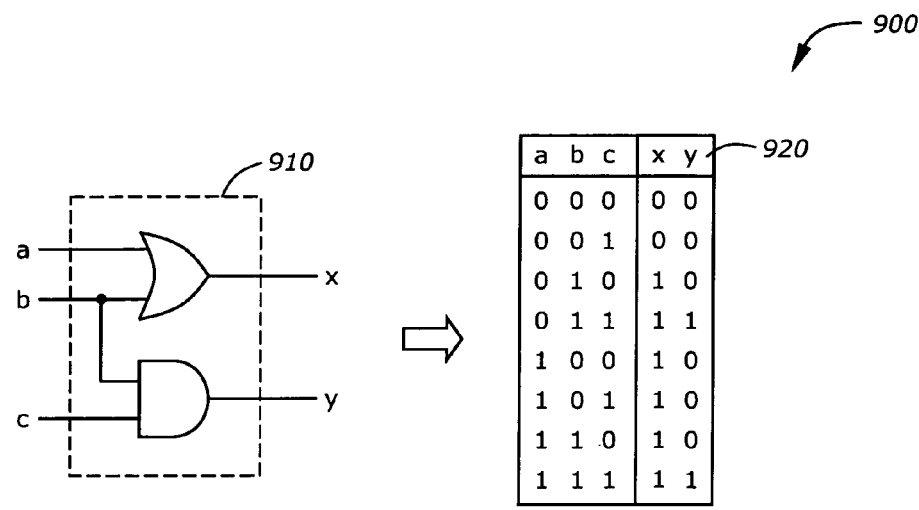
FIG. 9 is a diagram illustrating an example of a cut circuit according to one embodiment of the present invention.

FIG 9 is a diagram illustrating an example 900 of a cut circuit according to one embodiment of the present invention. The example 900 includes a circuit 910 and a truth table 920.

The circuit 910 includes an OR gate and an AND gate. The inputs to the circuit 910 are a, b, and c. The outputs of the circuit 910 are x and y. The truth table for the circuit 910 is:

| a | b | c | x | y |
|---|---|---|---|---|
| 0 | 0 | 0 | 0 | 0 |
| 0 | 0 | 1 | 0 | 0 |
| 0 | 1 | 0 | 1 | 0 |
| 0 | 1 | 1 | 1 | 1 |
| 1 | 0 | 0 | 1 | 0 |
| 1 | 0 | 1 | 1 | 0 |
| 1 | 1 | 0 | 1 | 0 |
| 1 | 1 | 1 | 1 | 1 |

Note that the range of the outputs x and y includes only 00, 10, and 11. The range does not include 01.

Figure 10:
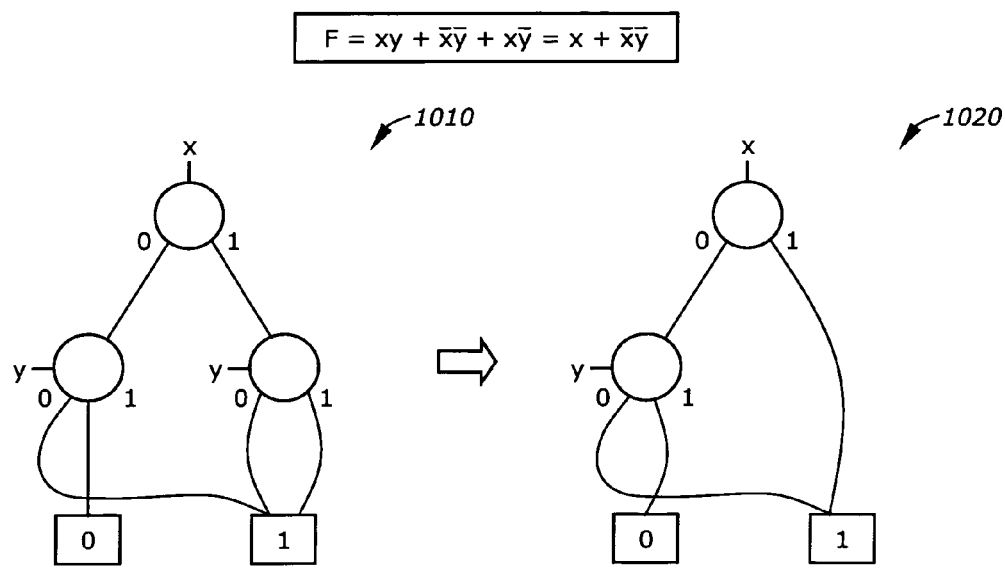
FIG. 10 is a diagram illustrating a reduced BDD of the circuit shown in FIG. 9 according to one embodiment of the invention.

FIG. 10 is a diagram illustrating a reduced BDD of the circuit shown in FIG. 9 according to one embodiment of the invention.

The Boolean relation for the characteristic function F is:

$$F = xy + x'y' + xy' = x + x'y' \quad (1)$$

where x' and y' are the complements of x and y, respectively.

From this, a BDD 1010 can be constructed directly. The BDD 1010 is then reduced to a BDD 1020. In the BDD 1020, there are two paths to logical 1: a path 0 corresponding to x=1, and a path 1 corresponding to x=0 and y=0. In other words, path 0 correspond to x and path 1 corresponds to x'y'. Since there are two paths leading to logical true, are two data variables. Denote these data variables D(0)=x and D(1)=y.

Figure 11:
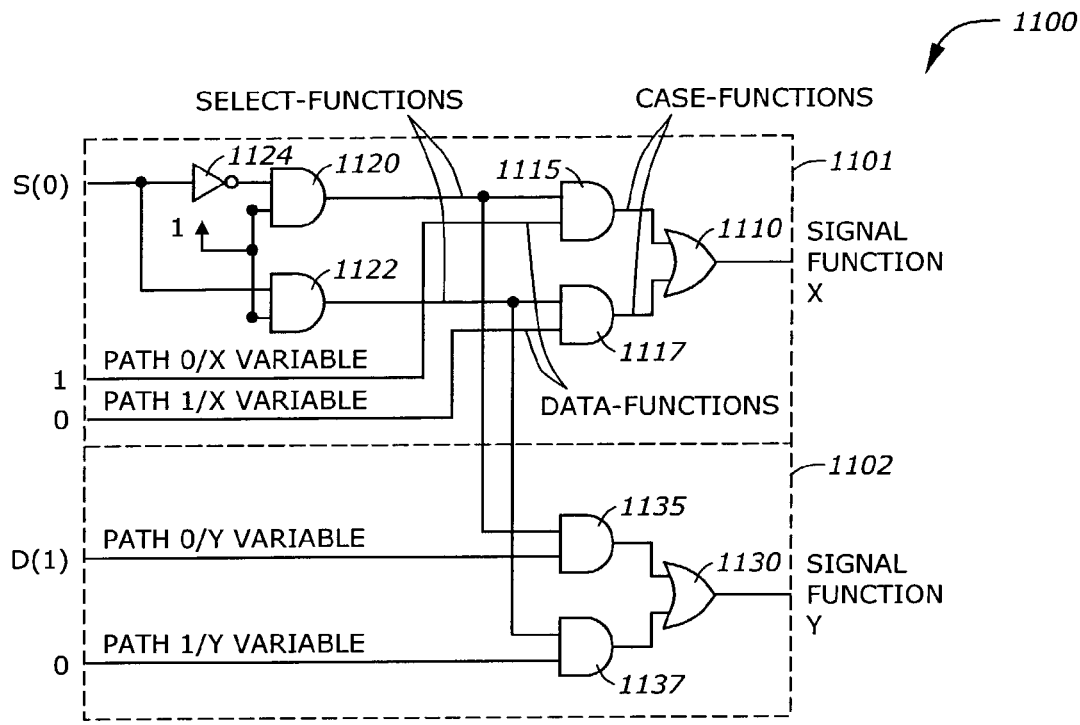
FIG. 11 is a diagram illustrating a preliminary range generator according to one embodiment of the invention.

FIG. 11 is a diagram illustrating a preliminary range generator 1100 according to one embodiment of the invention. The preliminary range generator 1100 includes a first path section 1101 and a second path section 1102. Since there are two true paths as shown in FIG. 10, there are two path sections. Also, there are two data variables D(0) and D(1), therefore there is one select variable S(0).

The first path section 1101 corresponds to signal function x and includes OR gate 1110, AND gates 1115 and 1117, AND gates 1120 and 1122, and inverter 1124. The OR gate 1110 OR two case functions as output from the AND gates 1115 and 1117. The AND gate 1115 performs an AND operation on the select function corresponding to the complemented minterm of the select variable S(0) and the data function corresponding to path 0 of the x variable. The logical condition on path 0 requires the data variable x=1, therefore, the data function on this path is associated with logical 1. The AND gate 1117 performs an AND operation on the select function corresponding to the minterm of the select variable S(0) and the data function corresponding to path 1 of the x variable. The logical condition on path 1 requires the data variable x=0, therefore, the data function on this path is associated with logical 0.

Similarly, the second path section 1102 corresponds to signal function y and includes OR gate 1130, and AND gates 1135 and 1137. The OR gate 1130 OR two case functions as output from the AND gates 1135 and 1137. The AND gate 1135 performs an AND operation on the select function corresponding to the complemented minterm of the select variable S(0) and the data function corresponding to path 0 of the y variable. The logical condition on path 0 does not require the y variable and is independent of the y variable, therefore, the data function on this path is associated with the data variable D(1). The AND gate 1137 performs an AND operation on the select function corresponding to the minterm of the select variable S(0) and the data function corresponding to path 1 of the y variable. The logical condition on path 1 requires the data variable y=0, therefore, the data function on this path is associated with logical 0.

Figure 12:
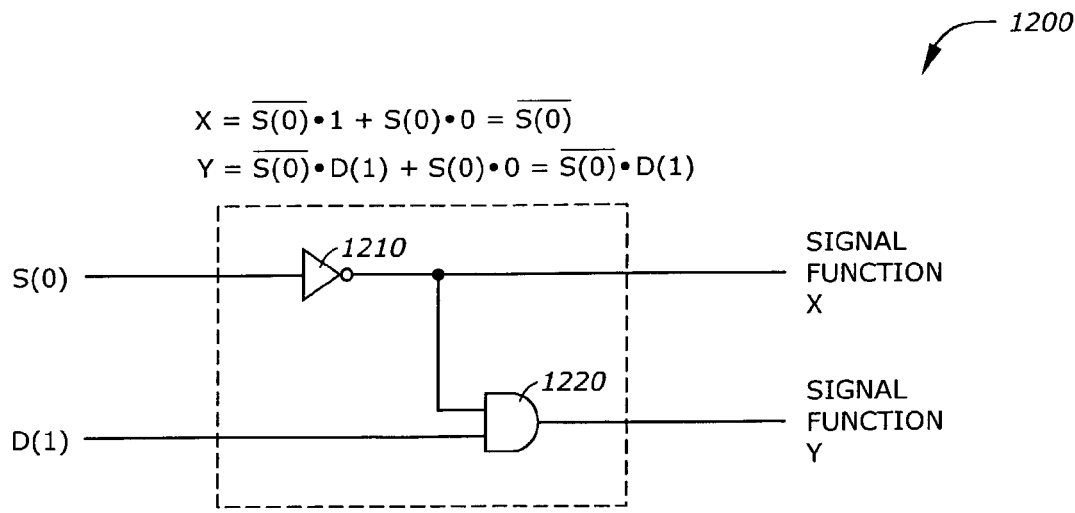
FIG. 12 is a diagram illustrating a simplified range generator according to one embodiment of the invention.

FIG. 12 is a diagram illustrating a simplified range generator 1200 according to one embodiment of the invention. The expressions for the signal functions x and y are written as follows based on the preliminary range operator 1100:

$$\text{New } x = S(0)'*1 + S(0)*0 = S(0)' \quad (2)$$

$$\text{New } y = S(0)'*D(1) + S(0)*0 = S(0)'*D(1) \quad (3)$$

where S(0)' denote the complement of S(0), * and + denote the AND and OR operators.

The simplified range generator 1200 is reduced to an inverter 1210 and an AND gate 1220. The truth table for this range generator is:

| S(0) | D(1) | New x | New y |
|------|------|-------|-------|
| 0    | 0    | 1     | 0     |
| 0    | 1    | 1     | 1     |
| 1    | 0    | 0     | 0     |
| 1    | 1    | 0     | 0     |

Note that the range includes 00, 10, and 11 and does not include 01. The simplified range generator 1200 therefore generates identical range as the cut circuit 910 shown in FIG. 1 with less variables and nodes. Note further that the inverter 1210 may be eliminated without changing the range.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
    constructing an exact range generator (RG) represented by a characteristic function of a range of a cut function for a first cut circuit in an implementation circuit and a second cut circuit in a reference circuit, the exact range generator being simpler than the first and second cut circuits and having a RG range identical to the range of the cut function; and
    checking equivalence of the implementation circuit and the reference circuit using the exact range generator.

2. The method of claim 1 wherein the checking equivalence comprises:
    replacing the first and second cut circuits by the exact range generator.

3. The method of claim 2 wherein the checking equivalence further comprises:
    obtaining first and second representations of the implementation and reference circuits using the exact range generator; and
    comparing the first and second representations.

4. The method of claim 2 wherein the checking equivalence further comprises:
    simplifying the implementation and reference circuits using the exact range generator; and
    comparing the simplified implementation and reference circuits.

5. The method of claim 1 wherein the checking equivalence comprises:
    computing a difference function between the implementation and the reference circuits using the cut function;
    replacing the cut function by a characteristic range function in the difference function; and
    determining logic values of the difference function using the characteristic range function.

6. The method of claim 1 further comprises:
    simplifying the characteristic function.

7. The method of claim 1 wherein the constructing the exact range generator comprises:
    simplifying the cut function such that the range is not changed.

8. The method of claim 1 wherein the constructing the exact range generator comprises:
    partitioning one of the first and second cut circuits into subcut circuits, each of the subcut circuits having a subcut range;
    creating sub range generators corresponding to the subcut circuits, each of the sub range generators having a sub range identical to the corresponding subcut range; and
    composing the sub range generators to form a superset range generator for the one of the first and second cut circuits.

9. The method of claim 1 wherein the constructing the exact range generator comprises:
    creating a reduced binary decision diagram (BDD) representing the characteristic function, the reduced BDD having N variables and P nodes; and
    constructing the exact range generator to generate the range using the reduced BDD, the range generator being represented by a range BDD having one of M variables, M being less than N, and Q nodes, Q being less than P.

10. The method of claim 9 wherein the creating the reduced BDD comprises:
    constructing a Boolean relation between input and output of one of the first and second cut circuits;
    converting the Boolean relation to the characteristic function, the characteristic function being true for achievable values of the range;
    representing the characteristic function by a first BDD having R variables; and
    re-ordering the R variables in the first BDD to generate the reduced BDD having less node count than the first BDD.

11. The method of claim 9 wherein the constructing the exact range generator comprises:
    determining C true paths in the reduced BDD leading to logical true;
    creating W data variables corresponding to the cut signals in one of the first and second cut circuits;
    creating S select variables, S being a smallest integer such that $2^S > C$; and
    evaluating a signal function for one of the cut signals in the one of the first and second cut circuits using the W data variables and the S select variables.

12. The method of claim 11 wherein the evaluating the signal function comprises:
associating a data function corresponding to a path in the true paths to one of logical false, logical true, and the one of the cut signals according to logical condition of one of the data variables at the path corresponding to the one of the cut signals;
perform an AND operation on a select function and the data function to provide one of C case functions, the select function being a minterm of one of the select variables; and
perform an OR operation on the C case functions to provide the signal function, each of the C case functions corresponding to the path.

13. The method of claim 12 wherein the associating the data function comprises:
associating the data function to logical false if the logical condition requires the one of the data variables being logical false;
associating the data function to logical true if the logical condition requires the one of the data variables being logical true; and
associating the data function to the one of the data variables if the logical condition is independent of the one of the data variables.

14. The method of claim 11 further comprising:
simplifying the signal function, the simplified signal function corresponding to one of range variables representing the range.

15. The method of claim 9 further comprising:
determining the first cut circuit associated with an implementation output signal and an implementation input signal of the implementation circuit, the implementation input signal having an implementation input name, the implementation output signal and an implementation input signal corresponding to a primary output and a primary input, respectively.

16. The method of claim 15 wherein the determining the first cut circuit comprises:
merging the implementation input signal with a reference input signal of the reference circuit, the reference input signal having a reference input name, the reference input name being same as the implementation input name; and
determining an implementation BDD and a reference BDD associated with the implementation output signal and the reference output signal, respectively.

17. The method of claim 16 further comprises:
constructing a graph having a plurality of nodes, each node corresponding to one of the implementation output signal and the reference output signal having a non-nil BDD;
assigning a weight associated with one of the nodes based on distance between the one of the nodes and a primary input node; and
selecting a subset of the nodes in the graph having minimum sum of weights associated with the nodes such that all paths from the implementation input signal to the implementation output signal passing through the subset.

18. The method of claim 16 further comprising:
determining a nil BDD for one of the implementation BDD and the reference BDD if a node count of the one of the implementation BDD and the reference BDD exceeds a node threshold.

19. A method comprising:
constructing an superset range generator (SRG) represented by a characteristic function of a range of a cut function for a first cut circuit in an implementation circuit and a second cut circuit in a reference circuit, the SRG being simpler than the first and second cut circuits and having a SRG range larger than the range of the cut function; and
checking equivalence of the implementation circuit and the reference circuit using the SRG.

20. The method of claim 19 wherein the checking equivalence comprises:
replacing the first and second cut circuits by the SRG.

21. The method of claim 20 wherein the checking equivalence further comprises:
obtaining first and second representations of the implementation and reference circuits using the SRG; and
comparing the first and second representations.

22. The method of claim 20 wherein the checking equivalence further comprises:
simplifying the implementation and reference circuits using the SRG; and
comparing the simplified implementation and reference circuits.

23. The method of claim 19 wherein the checking equivalence comprises:
computing a difference function between the implementation and the reference circuits using the cut function;
replacing the cut function by a characteristic range function in the difference function; and
determining logic values of the difference function using the characteristic range function.

24. The method of claim 19 further comprises:
simplifying the characteristic function.

25. The method of claim 19 wherein the constructing the SRG comprises:
simplifying the cut function such that the SRG range is larger than the range.

26. The method of claim 19 wherein the constructing the SRG comprises:
partitioning one of the first and second cut circuits into subcut circuits, each of the subcut circuits having a subcut range; and
creating sub range generators corresponding to the subcut circuits, each of the sub range generators having a sub range identical to the corresponding subcut range; and
composing the sub range generators to form the SRG for the one of the first and second cut circuits.

27. The method of claim 19 wherein the constructing the SRG comprises:
creating a reduced binary decision diagram (BDD) representing the characteristic function, the reduced BDD having N variables and P nodes; and
constructing the SRG to generate the range using the reduced BDD, the SRG being represented by a range BDD having one of M variables, M being less than N, and Q nodes, Q being less than P.

28. The method of claim 27 wherein the creating the reduced BDD comprises:
constructing a Boolean relation between input and output of one of the first and second cut circuits;
converting the Boolean relation to the characteristic function, the characteristic function being true for achievable values of the range;
representing the characteristic function by a first BDD having R variables; and re-ordering the R variables in the first BDD to generate the reduced BDD having less node count than the first BDD.

29. The method of claim 27 wherein the constructing the SRG comprises:
determining C true paths in the reduced BDD leading to logical true;
creating W data variables corresponding to the cut signals in the cut circuit;
creating S select variables, S being a smallest integer such that $2^S > C$; and
evaluating a signal function for one of the cut signals in the cut circuit using the W data variables and the S select variables.

30. The method of claim 29 wherein the evaluating the signal function comprises:
associating a data function corresponding to a path in the true paths to one of logical false, logical true, and the one of the cut signals according to logical condition of one of the data variables at the path corresponding to the one of the cut signals;
perform an AND operation on a select function and the data function to provide one of C case functions, the select function being a minterm of one of the select variables; and
perform an OR operation on the C case functions to provide the signal function, each of the C case functions corresponding to the path.

31. The method of claim 30 wherein the associating the data function comprises:
associating the data function to logical false if the logical condition requires the one of the data variables being logical false;
associating the data function to logical true if the logical condition requires the one of the data variables being logical true; and
associating the data function to the one of the data variables if the logical condition is independent of the one of the data variables.

32. The method of claim 29 further comprising:
simplifying the signal function, the simplified signal function corresponding to one of range variables representing the range.

33. The method of claim 27 further comprising:
determining the first cut circuit associated with an implementation output signal and an implementation input signal of the implementation circuit, the implementation input signal having an implementation input name, the implementation output signal and an implementation input signal corresponding to a primary output and a primary input, respectively.

34. The method of claim 33 wherein the determining the first cut circuit comprises:
merging the implementation input signal with a reference input signal of the reference circuit, the reference input signal having a reference input name, the reference input name being same as the implementation input name; and
determining an implementation BDD and a reference BDD associated with the implementation output signal and the reference output signal, respectively.

35. The method of claim 34 further comprises:
constructing a graph having a plurality of nodes, each node corresponding to one of the implementation output signal and the reference output signal having a non-nil BDD;
assigning a weight associated with one of the nodes based on distance between the one of the nodes and a primary input node; and
selecting a subset of the nodes in the graph having minimum sum of weights associated with the nodes such that all paths from the implementation input signal to the implementation output signal passing through the subset.

36. The method of claim 34 further comprising:
determining a nil BDD for one of the implementation BDD and the reference BDD if a node count of the one of the implementation BDD and the reference BDD exceeds a node threshold.

37. An article of manufacture comprising:
a machine-accessible medium including data that, when accessed by a machine, causes the machine to perform operations comprising:
constructing an exact range generator (RG) represented by a characteristic function of a range of a cut function for a first cut circuit in an implementation circuit and a second cut circuit in a reference circuit, the exact range generator being simpler than the first and second cut circuits and having a RG range identical to the range of the cut function; and
checking equivalence of the implementation circuit and the reference circuit using the exact range generator.

38. The article of manufacture of claim 37 wherein the data that causes the machine to perform checking equivalence includes data, when accessed by the machine causes the machine to perform operations comprising:
replacing the first and second cut circuits by the exact range generator.

39. The article of manufacture of claim 38 wherein the data that causes the machine to perform checking equivalence further includes data, when accessed by the machine causes the machine to perform operations comprising:
obtaining first and second representations of the implementation and reference circuits using the exact range generator; and
comparing the first and second representations.

40. The article of manufacture of claim 38 wherein the data that causes the machine to perform checking equivalence further includes data, when accessed by the machine causes the machine to perform operations comprising:
simplifying the implementation and reference circuits using the exact range generator; and
comparing the simplified implementation and reference circuits.

41. The article of manufacture of claim 37 wherein the data that causes the machine to perform checking equivalence includes data, when accessed by the machine causes the machine to perform operations comprising:
computing a difference function between the implementation and the reference circuits using the cut function;
replacing the cut function by a characteristic range function in the difference function; and
determining logic values of the difference function using the characteristic range function.

42. The article of manufacture of claim 37 the data further causes the machine to perform operations comprising:
simplifying the characteristic function.

43. The article of manufacture of claim 37 wherein the data that causes the machine to perform constructing the exact range generator includes data, when accessed by the machine causes the machine to perform operations comprising:

simplifying the cut function such that the range is not changed.

44. The article of manufacture of claim 37 wherein the data that causes the machine to perform constructing the exact range generator includes data, when accessed by the machine causes the machine to perform operations comprising:
    partitioning one of the first and second cut circuits into subcut circuits, each of the subcut circuits circuit and having a subcut range;
    creating sub range generators corresponding to the subcut circuits, each of the sub range generators having a sub range identical to the corresponding subcut range; and
    composing the sub range generators to form a superset range generator for the one of the first and second cut circuits.

45. The article of manufacture of claim 37 wherein the data that causes the machine to perform constructing the exact range generator includes data, when accessed by the machine causes the machine to perform operations comprising:
    creating a reduced binary decision diagram (BDD) representing the characteristic function, the reduced BDD having N variables and P nodes; and
    constructing the exact range generator to generate the range using the reduced BDD, the range generator being represented by a range BDD having one of M variables, M being less than N, and Q nodes, Q being less than P.

46. The article of manufacture of claim 45 wherein the data that causes the machine to perform creating the reduced BDD includes data, when accessed by the machine causes the machine to perform operations comprising:
    constructing a Boolean relation between input and output of one of the first and second cut circuits;
    converting the Boolean relation to the characteristic function, the characteristic function being true for achievable values of the range;
    representing the characteristic function by a first BDD having R variables; and
    re-ordering the R variables in the first BDD to generate the reduced BDD having less node count than the first BDD.

47. The article of manufacture of claim 45 wherein the data that causes the machine to perform constructing the exact range generator includes data, when accessed by the machine causes the machine to perform operations comprising:
    determining C true paths in the reduced BDD leading to logical true;
    creating W data variables corresponding to the cut signals in one of the first and second cut circuits;
    creating S select variables, S being a smallest integer such that $2^S > C$; and
    evaluating a signal function for one of cut signals in the one of the first and second cut circuits using the W data variables and the S select variables.

48. The article of manufacture of claim 47 wherein the data that causes the machine to perform evaluating the signal function includes data, when accessed by the machine causes the machine to perform operations comprising:
    associating a data function corresponding to a path in the true paths to one of logical false, logical true, and the one of the cut signals according to logical condition of one of the data variables at the path corresponding to the one of the cut signals;
    performing an AND operation on a select function and the data function to provide one of C case functions, the select function being a minterm of one of the select variables; and
    performing an OR operation on the C case functions to provide the signal function, each of the C case functions corresponding to the path.

49. The article of manufacture of claim 48 wherein the data that causes the machine to perform associating the data function includes data, when accessed by the machine causes the machine to perform operations comprising:
    associating the data function to logical false if the logical condition requires the one of the data variables being logical false;
    associating the data function to logical true if the logical condition requires the one of the data variables being logical true; and
    associating the data function to the one of the data variables if the logical condition is independent of the one of the data variables.

50. The article of manufacture of claim 47 wherein the data further causes the machine to perform operations comprising:
    simplifying the signal function, the simplified signal function corresponding to one of range variables representing the range.

51. The article of manufacture of claim 45 wherein the data further causes the machine to perform operations comprising:
    determining the first cut circuit associated with an implementation output signal and an implementation input signal of the implementation circuit, the implementation input signal having an implementation input name, the implementation output signal and the implementation input signal corresponding to a primary output and a primary input, respectively.

52. The article of manufacture of claim 51 wherein the data that causes the machine to perform determining the first cut circuit includes data, when accessed by the machine causes the machine to perform operations comprising:
    merging the implementation input signal with a reference input signal of the reference circuit, the reference input signal having a reference input name, the reference input name being same as the implementation input name; and
    determining an implementation BDD and a reference BDD associated with the implementation output signal and the reference output signal, respectively.

53. The article of manufacture of claim 52 wherein the data further causes the machine to perform operations comprising:
    constructing a graph having a plurality of nodes, each node corresponding to one of the implementation output signal and the reference output signal having a non-nil BDD;
    assigning a weight associated with one of the nodes based on distance between the one of the nodes and a primary input node; and
    selecting a subset of the nodes in the graph having minimum sum of weights associated with the nodes such that all paths from the implementation input signal to the implementation output signal passing through the subset.

54. The article of manufacture of claim 52 wherein the data further causes the machine to perform operations comprising:
determining a nil BDD for one of the implementation BDD and the reference BDD if a node count of the one of the implementation BDD and the reference BDD exceeds a node threshold.

55. An article of manufacture comprising:
a machine-accessible medium including data that, when accessed by a machine, causes the machine to perform operations comprising:
constructing an superset range generator (SRG) represented by a characteristic function of a range of a cut function for a first cut circuit in an implementation circuit and a second cut circuit in a reference circuit, the SRG being simpler than the cut circuit and having a SRG range larger than the range of the cut function; and
checking equivalence of the implementation circuit and the reference circuit using the SRG.

56. The article of manufacture of claim 55 wherein the data that causes the machine to perform checking equivalence includes data, when accessed by the machine causes the machine to perform operations comprising:
replacing the first and second cut circuits by the SRG.

57. The article of manufacture of claim 56 wherein the data that causes the machine to perform checking equivalence further includes data, when accessed by the machine causes the machine to perform operations comprising:
obtaining first and second representations of the implementation and reference circuits using the SRG; and
comparing the first and second representations.

58. The article of manufacture of claim 56 wherein the data that causes the machine to perform checking equivalence further includes data, when accessed by the machine causes the machine to perform operations comprising:
simplifying the implementation and reference circuits using the SRG; and
comparing the simplified implementation and reference circuits.

59. The article of manufacture of claim 55 wherein the data that causes the machine to perform checking equivalence includes data, when accessed by the machine causes the machine to perform operations comprising:
computing a difference function between the implementation and the reference circuits using the cut function;
replacing the cut function by a characteristic range function in the difference function; and
determining logic values of the difference function using the characteristic range function.

60. The article of manufacture of claim 55 wherein the data further causes the machine to perform operations comprising:
simplifying the characteristic function.

61. The article of manufacture of claim 55 wherein the data that causes the machine to perform constructing the SRG includes data, when accessed by the machine causes the machine to perform operations comprising:
simplifying the cut function such that the SRG range is larger than the range.

62. The article of manufacture of claim 55 wherein the data that causes the machine to perform constructing the SRG includes data, when accessed by the machine causes the machine to perform operations comprising:
partitioning one of the first and second cut circuits into subcut circuits, each of the subcut circuits having a subcut range; and
creating sub range generators corresponding to the subcut circuits, each of the sub range generators having a sub range identical to the corresponding subcut range; and
composing the sub range generators to form the SRG for the one of the first and second cut circuits.

63. The article of manufacture of claim 55 wherein the data that causes the machine to perform constructing the SRG includes data, when accessed by the machine causes the machine to perform operations comprising:
creating a reduced binary decision diagram (BDD) representing the characteristic function, the reduced BDD having N variables and P nodes; and
constructing the SRG to generate the range using the reduced BDD, the SRG being represented by a range BDD having one of M variables, M being less than N, and Q nodes, Q being less than P.

64. The article of manufacture of claim 63 wherein the data that causes the machine to perform creating the reduced BDD includes data, when accessed by the machine causes the machine to perform operations comprising:
constructing a Boolean relation between input and output of one of the first and second cut circuits;
converting the Boolean relation to the characteristic function, the characteristic function being true for achievable values of the range;
representing the characteristic function by a first BDD having R variables; and
re-ordering the R variables in the first BDD to generate the reduced BDD having less node count than the first BDD.

65. The article, of manufacture of claim 63 wherein the data that causes the machine to perform constructing the SRG includes data, when accessed by the machine causes the machine to perform operations comprising:
determining C true paths in the reduced BDD leading to logical true;
creating W data variables corresponding to the cut signals in the cut circuit;
creating S select variables, S being a smallest integer such that $2^S > C$; and
evaluating a signal function for one of the cut signals in the cut circuit using the W data variables and the S select variables.

66. The article of manufacture of claim 65 wherein the data that causes the machine to perform evaluating the signal function includes data, when accessed by the machine causes the machine to perform operations comprising:
associating a data function corresponding to a path in the true paths to one of logical false, logical true, and the one of the cut signals according to logical condition of one of the data variables at the path corresponding to the one of the cut signals;
performing an AND operation on a select function and the data function to provide one of C case functions, the select function being a minterm of one of the select variables; and
performing an OR operation on the C case functions to provide the signal function, each of the C case functions corresponding to the path.

67. The article of manufacture of claim 66 wherein the data that causes the machine to perform associating the data function includes data, when accessed by the machine causes the machine to perform operations comprising:
associating the data function to logical false if the logical condition requires the one of the data variables being logical false;

associating the data function to logical true if the logical condition requires the one of the data variables being logical true; and associating the data function to the one of the data variables if the logical condition is independent of the one of the data variables.

68. The article of manufacture of claim 65 wherein the data further causes the machine to perform operations comprising:

simplifying the signal function, the simplified signal function corresponding to one of range variables representing the range.

69. The article of manufacture of claim 63 wherein the data further causes the machine to perform operations comprising:

determining the first cut circuit associated with an implementation output signal and an implementation input signal of the implementation circuit, the implementation input signal having an implementation input name, the implementation output signal and the implementation input signal corresponding to a primary output and a primary input, respectively.

70. The article of manufacture of claim 69 wherein the data that causes the machine to perform determining the first cut circuit includes data, when accessed by the machine causes the machine to perform operations comprising:

merging the implementation input signal with a reference input signal of the reference circuit, the reference input signal having a reference input name, the reference input name being same as the implementation input name; and determining an implementation BDD and a reference BDD associated with the implementation output signal and the reference output signal, respectively.

71. The article of manufacture of claim 70 wherein the data further causes the machine to perform operations comprising:

constructing a graph having a plurality of nodes, each node corresponding to one of the implementation output signal and the reference output signal having a non-nil BDD;

assigning a weight associated with one of the nodes based on distance between the one of the nodes and a primary input node; and selecting a subset of the nodes in the graph having minimum sum of weights associated with the nodes such that all paths from the implementation input signal to the implementation output signal passing through the subset.

72. The article of manufacture of claim 70 wherein the data further causes the machine to perform operations comprising:

determining a nil BDD for one of the implementation BDD and the reference BDD if a node count of the one of the implementation BDD and the reference BDD exceeds a node threshold.

73. A system comprises:

a processor; and a memory coupled to the processor containing an electronic design automation (EDA) tool, the EDA tool, when executed, causes the processor to:

construct an exact range generator (RG) represented by a characteristic function of a range of a cut function for a first cut circuit in an implementation circuit and a second cut circuit in a reference circuit, the exact range generator being simpler than the first and second cut circuits and having a RG range identical to the range of the cut function, and check equivalence of the implementation circuit and the reference circuit using the exact range generator.

74. The system of claim 73 wherein the EDA tool causing the processor to check equivalence causes the processor to:

replace the first and second cut circuits by the exact range generator.

75. The system of claim 74 wherein the EDA tool causing the processor to check equivalence further causes the processor to:

obtain first and second representations of the implementation and reference circuits using the exact range generator; and compare the first and second representations.

76. The system of claim 74 wherein the EDA tool causing the processor to check equivalence further causes the processor to:

simplify the implementation and reference circuits using the exact range generator; and compare the simplified implementation and reference circuits.

77. The system of claim 73 wherein the EDA tool causing the processor to check equivalence causes the processor to:

compute a difference function between the implementation and the reference circuits using the cut function;

replace the cut function by a characteristic range function in the difference function; and determine logic values of the difference function using the characteristic range function.

78. The system of claim 73 the EDA tool further causes the processor to:

simplify the characteristic function.

79. The system of claim 73 wherein the EDA tool causing the processor to construct the exact range generator causes the processor to:

simplify the cut function such that the range is not changed.

80. The system of claim 73 wherein the EDA tool causing the processor to construct the exact range generator causes the processor to:

partition one of the first and second cut circuits into subcut circuits, each of the subcut circuits and having a subcut range;

create sub range generators corresponding to the sub cut circuits, each of the sub range generators having a sub range identical to the corresponding sub cut range; and compose the sub range generators to form a superset range generator for the one of the first and second cut circuits.

81. The system of claim 73 wherein the EDA tool causing the processor to construct the exact range generator causes the processor to:

create a reduced binary decision diagram (BDD) representing the characteristic function, the reduced BDD having N variables and P nodes; and construct the range generator to generate the range using the reduced BDD, the range generator being represented by a range BDD having one of M variables, M being less than N, and Q nodes, Q being less than P.

82. The system of claim 81 wherein the EDA tool causing the processor to create the reduced BDD causes the processor to:

construct a Boolean relation between input and output of one of the first and second cut circuits;

convert the Boolean relation to the characteristic function, the characteristic function being true for achievable values of the range;
represent the characteristic function by a first BDD having R variables; and
re-order the R variables in the first BDD to generate the reduced BDD having less node count than the first BDD.

83. The system of claim 81 wherein the EDA tool causing the processor to construct the exact range generator causes the processor to:
determine C. true paths in the reduced BDD leading to logical true;
create W data variables corresponding to the cut signals in one of the first and second cut circuits;
create S select variables, S being a smallest integer such that $2^S > C$; and
evaluate a signal function for one of cut signals in the one of the first and second cut circuits using the W data variables and the S select variables.

84. The system of claim 83 wherein the EDA tool causing the processor to evaluate the signal function causes the processor to:
associate a data function corresponding to a path in the true paths to one of logical false, logical true, and the one of the cut signals according to logical condition of one of the data variables at the path corresponding to the one of the cut signals;
perform an AND operation on a select function and the data function to provide one of C case functions, the select function being a minterm of one of the select variables; and
perform an OR operation on the C case functions to provide the signal function, each of the C case functions corresponding to the path.

85. The system of claim 84 wherein the EDA tool causing the processor to associate the data function causes the processor to:
associate the data function to logical false if the logical condition requires the one of the data variables being logical false;
associate the data function to logical true if the logical condition requires the one of the data variables being logical true; and
associate the data function to the one of the data variables if the logical condition is independent of the one of the data variables.

86. The system of claim 83 the EDA tool further causes the processor to:
simplify the signal function, the simplified signal function corresponding to one of range variables representing the range.

87. The system of claim 81 the EDA tool further causes the processor to:
determine the first cut circuit associated with an implementation output signal and an implementation input signal of the implementation circuit, the implementation input signal having an implementation input name, the implementation output signal and the implementation input signal corresponding to a primary output and a primary input, respectively.

88. The system of claim 87 wherein the EDA tool causing the processor to determine the first cut circuit causes the processor to:
merge the implementation input signal with a reference input signal of the reference circuit, the reference input signal having a reference input name, the reference input name being same as the implementation input name; and
determine an implementation BDD and a reference BDD associated with the implementation output signal and the reference output signal, respectively.

89. The system of claim 88 the EDA tool further causes the processor to:
construct a graph having a plurality of nodes, each node corresponding to one of the implementation output signal and the reference output signal having a non-nil BDD;
assign a weight associated with one of the nodes based on distance between the one of the nodes and a primary input node; and
select a subset of the nodes in the graph having minimum sum of weights associated with the nodes such that all paths from the implementation input signal to the implementation output signal passing through the subset.

90. The system of claim 88 the EDA tool further causes the processor to:
determine a nil BDD for one of the implementation BDD and the reference BDD if a node count of the one of the implementation BDD and the reference BDD exceeds a node threshold.

91. A system comprising:
a processor; and
a memory coupled to the processor containing an electronic design automation (EDA) tool, the EDA tool, when executed, causes the processor to:
construct an superset range generator (SRG) represented by a characteristic function of a range of a cut function for a first cut circuit in an implementation circuit and a second cut circuit in a reference circuit, the SRG being simpler than the cut circuit and having a SRG range larger than the range of the cut function; and
check equivalence of the implementation circuit and the reference circuit using the SRG.

92. The system of claim 91 wherein the EDA tool causing the processor to check equivalence causes the processor to:
replace the first and second cut circuits by the SRG.

93. The system of claim 92 wherein the EDA tool causing the processor to check equivalence further causes the processor to:
obtain first and second representations of the implementation and reference circuits using the SRG; and
compare the first and second representations.

94. The system of claim 92 wherein the EDA tool causing the processor to check equivalence causes the processor to:
simplify the implementation and reference circuits using the SRG; and
compare the simplified implementation and reference circuits.

95. The system of claim 91 wherein the EDA tool causing the processor to check equivalence causes the processor to:
compute a difference function between the implementation and the reference circuits using the cut function;
replace the cut function by a characteristic range function in the difference function; and
determine logic values of the difference function using the characteristic range function.

96. The system of claim 91 wherein the EDA tool further causes the processor to:
simplify the characteristic function.

97. The system of claim 91 wherein the EDA tool causing the processor to construct the SRG causes the processor to:
simplify the cut function such that the SRG range is larger than the range of the cut function.

98. The system of claim 91 wherein the EDA tool causing the processor to construct the SRG causes the processor to:
partition one of the first and second cut circuits into subcut circuits, each of the subcut circuits having a subcut range;
create sub range generators corresponding to the subcut circuits, each of the sub range generators having a sub range identical to the corresponding subcut range; and
compose the sub range generators to form the SRG for the one of the first and second cut circuits.

99. The system of claim 91 wherein the EDA tool causing the processor to construct the SRG causes the processor to:
create a reduced binary decision diagram (BDD) representing the characteristic function, the reduced BDD having N variables and P nodes; and
construct the SRG to generate the range using the reduced BDD, the SRG being represented by a range BDD having one of M variables, M being less than N, and Q nodes, Q being less than P.

100. The system of claim 91 wherein the EDA tool causing the processor to create the reduced BDD check equivalence causes the processor to:
construct a Boolean relation between input and output of one of the first and second cut circuits;
convert the Boolean relation to the characteristic function, the characteristic function being true for achievable values of the range;
represent the characteristic function by a first BDD having R variables; and
re-order the R variables in the first BDD to generate the reduced BDD having less node count than the first BDD.

101. The system of claim 91 wherein the EDA tool causing the processor to construct the SRG causes the processor to:
determine C true paths in the reduced BDD leading to logical true;
create W data variables corresponding to cut signals in the first and second cut circuits;
create S select variables, S being a smallest integer such that $2^S>C$; and
evaluate a signal function for one of the cut signals in the cut circuit using the W data variables and the S select variables.

102. The system of claim 91 wherein the EDA tool causing the processor to evaluate the signal function causes the processor to:
associate a data function corresponding to a path in the true paths to one of logical false, logical true, and the one of the cut signals according to logical condition of one of the data variables at the path corresponding to the one of the cut signals;
perform an AND operation on a select function and the data function to provide one of C case functions, the select function being a minterm of one of the select variables; and
perform an OR operation on the C case functions to provide the signal function, each of the C case functions corresponding to the path.

103. The system of claim 102 wherein the EDA tool causing the processor to associate the data function causes the processor to:
associate the data function to logical false if the logical condition requires the one of the data variables being logical false;
associate the data function to logical true if the logical condition requires the one of the data variables being logical true; and
associate the data function to the one of the data variables if the logical condition is independent of the one of the data variables.

104. The system of claim 101 the EDA tool further causes the processor to:
simplify the signal function, the simplified signal function corresponding to one of range variables representing the range.

105. The system of claim 99 the EDA tool further causes the processor to:
determine the first cut circuit associated with an implementation output signal and an implementation input signal of the implementation circuit, the implementation input signal having an implementation input name, the implementation output signal and the implementation input signal corresponding to a primary output and a primary input, respectively.

106. The system of claim 105 wherein the EDA tool causing the processor to determine the first cut circuit causes the processor to:
merge the implementation input signal with a reference input signal of the reference circuit, the reference input signal having a reference input name, the reference input name being same as the implementation input name; and
determine an implementation BDD and a reference BDD associated with the implementation output signal and the reference output signal, respectively.

107. The system of claim 106 the EDA tool further causes the processor to:
construct a graph having a plurality of nodes, each node corresponding to one of the implementation output signal and the reference output signal having a non-nil BDD;
assign a weight associated with one of the nodes based on distance between the one of the nodes and a primary input node; and
select a subset of the nodes in the graph having minimum sum of weights associated with the nodes such that all paths from the implementation input signal to the implementation output signal passing through the subset.

108. The system of claim 106 the EDA tool further causes the processor to:
determine a nil BDD for one of the implementation BDD and the reference BDD if a node count of the one of the implementation BDD and the reference BDD exceeds a node threshold.

* * * * *